(12) United States Patent
Kim et al.

(10) Patent No.: US 9,685,522 B1
(45) Date of Patent: Jun. 20, 2017

(54) FORMING UNIFORM WF METAL LAYERS IN GATE AREAS OF NANO-SHEET STRUCTURES

(71) Applicant: GLOBALFOUNDRIES Inc., Grand Cayman (KY)

(72) Inventors: Hoon Kim, Clifton Park, NY (US); Min Gyu Sung, Latham, NY (US); Ruilong Xie, Niskayuna, NY (US); Chanro Park, Clifton Park, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/093,952

(22) Filed: Apr. 8, 2016

(51) Int. Cl.
*H01L 29/51* (2006.01)
*H01L 29/423* (2006.01)
*H01L 29/66* (2006.01)
*H01L 21/28* (2006.01)

(52) U.S. Cl.
CPC .. *H01L 29/42392* (2013.01); *H01L 21/28088* (2013.01); *H01L 29/517* (2013.01); *H01L 29/66742* (2013.01)

(58) Field of Classification Search
CPC ..... H01L 29/51; H01L 29/513; H01L 29/517; H01L 29/518
USPC .......................................................... 257/410
See application file for complete search history.

(56) References Cited

U.S. PATENT DOCUMENTS 7,394,103 B2 * 7/2008 Gerbi .................. H01L 21/0237
257/410

* cited by examiner

*Primary Examiner* — Monica D Harrison
(74) *Attorney, Agent, or Firm* — Ditthavong & Steiner, P.C.

(57) ABSTRACT

Methods for forming uniform WF metal layers in gate areas of NS structures in a NS FET and the resulting devices are disclosed. Embodiments include providing NS structures, parallel to and spaced from each other, in a substrate; conformally forming gate dielectric and metal layers, respectively, on all surfaces in a gate area of each NS structure; forming a barrier layer on surfaces in the gate area of each NS structure except on surfaces in between the NS structures by PVD or PECVD; annealing the NS structures including the gate dielectric and metal layers; removing the barrier and metal layers from all surfaces; and forming a WF metal layer on all surfaces in the gate area of each NS structure.

20 Claims, 5 Drawing Sheets

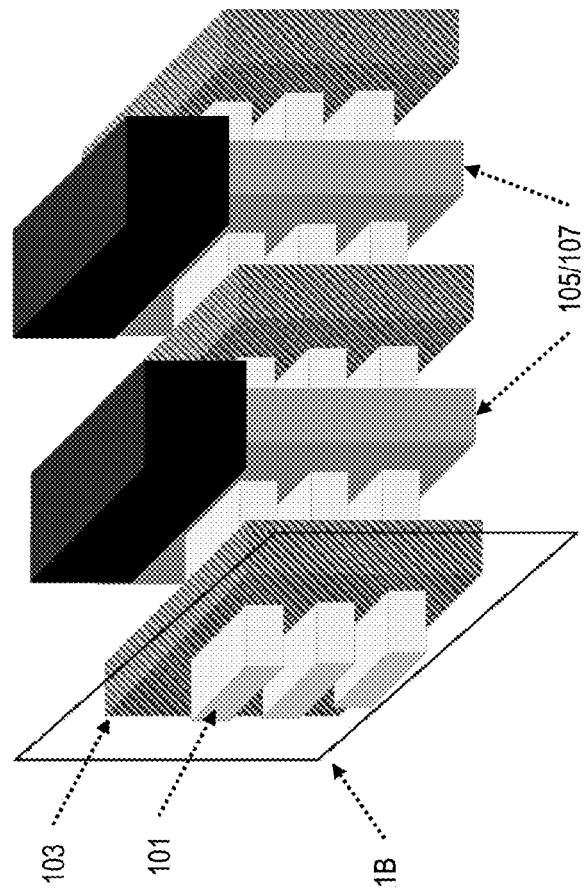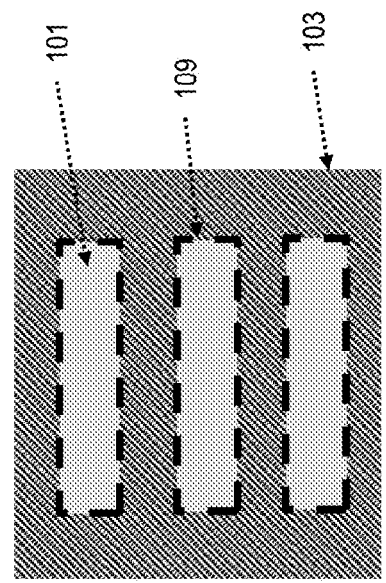
FIG. 1A
BACKGROUND
FIG. 1B
BACKGROUND

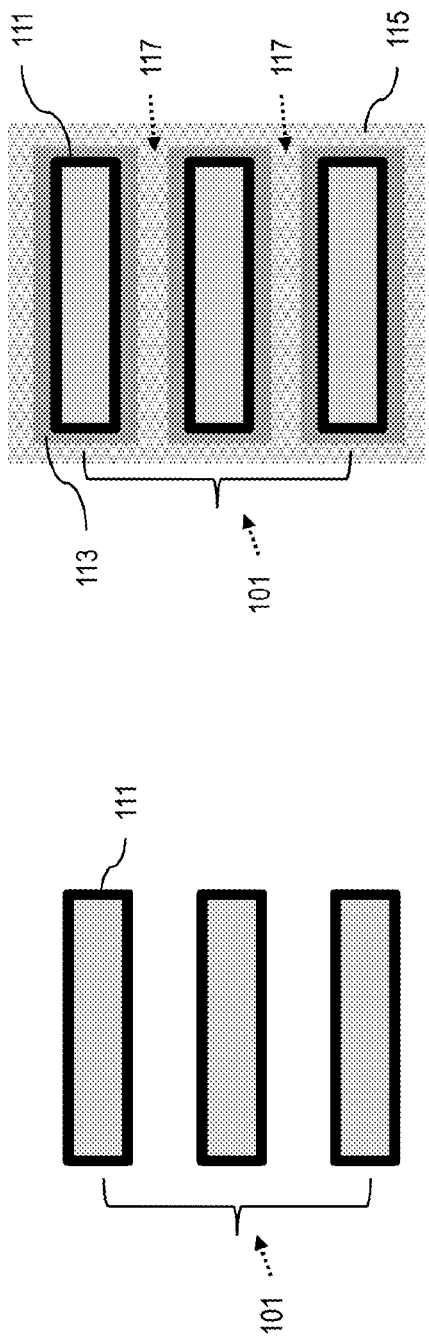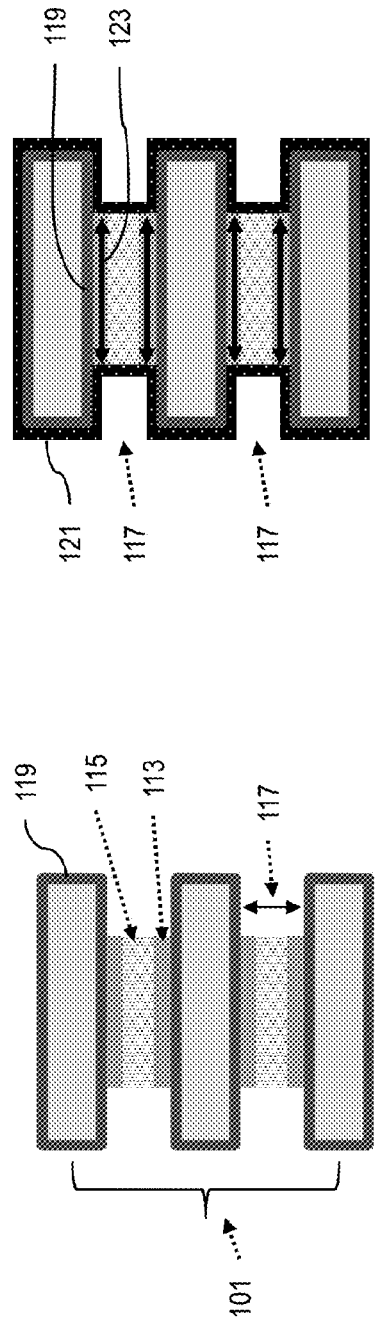
FIG. 1C BACKGROUND
FIG. 1D BACKGROUND
FIG. 1E BACKGROUND
FIG. 1F BACKGROUND

US 9,685,522 B1

FORMING UNIFORM WF METAL LAYERS IN GATE AREAS OF NANO-SHEET STRUCTURES

TECHNICAL FIELD

The present disclosure relates generally to designing and fabricating integrated circuit (IC) devices. The present disclosure is particularly applicable to formation of uniform work-function (WF) material in gate areas of nano-sheet (NS) structures in NS field-effect transistors (NS FETs), particularly for the 7 nanometer (nm) technology node and beyond.

BACKGROUND

Generally, various advanced processes and techniques may be employed in design and fabrication of IC devices, particularly to aid with reducing the geometries of components and structures utilized to scale down IC devices beyond 7 nm. A NS FET may employ a stack of NS structures (e.g. horizontal semiconductor sheets) as gated conduction channels between source/drain (S/D) regions of the transistor, wherein the gate surrounds, i.e. gate-all-around (GAA), a gate region of each NS structure in the transistor. However, the reduced spaces between the NS structures present challenging steps for the traditional processes.

FIG. 1A illustrates a NS FET including NS structures 101, gate structures 103, and S/D regions 105 and 107. FIG. 1B illustrates a cross-sectional view along a cross-sectional plane 1B of FIG. 1A, wherein a gate structure 103 is a GAA surrounding a gate region 109 of each NS structure 101.

FIGS. 1C through 1F illustrate the conventional process for forming the structure of FIGS. 1A and 1B. Adverting to FIG. 1C, a gate dielectric layer 111 is illustrated surrounding the gate regions of the NS structures 101. FIG. 1D illustrates formation of gate metal layers 113 such as titanium nitride (TiN) formed by atomic layer deposition (ALD) surrounding the gate dielectric layers 111 of the NS structures 101. An annealing barrier layer 115 (e.g. silicon (Si)) is formed by chemical vapor deposition (CVD) surrounding the gate metal layers 113 as well as filling spaces 117 between adjacent NS structures 101. Spaces 117 may be less than 5 nanometers (nm).

In FIG. 1E, after an annealing process, the barrier layer 115 and the gate metal layers 113 are removed to expose the annealed gate dielectric layer 119 surrounding each gate area of the NS structures 101. However, as illustrated, some sections of the gate metal layers 113 and the barrier layer 115 are not removed completely, leaving residue in the spaces 117 between the adjacent NS structures 101. The residue results from a process (e.g. etching) being unable to remove those sections due to a pinching off due to a close proximity (e.g. the small spaces 117) of the NS structures 101 to each other.

Adverting to FIG. 1F, a WF layer 121 is formed surrounding the annealed gate dielectric layer 119; however, the WF layer 121 is not formed on sections 123 of the annealed gate dielectric layer 119 in the spaces 117. The incomplete layer of the WF metal layer 121 around each NS structure 101 can negatively impact channel performance of the NS structures 101 and threshold voltage (Vt) controllability.

Therefore, a need exists for methodology enabling a pinch-off free annealing process for NS structures and the resulting devices.

SUMMARY

An aspect of the present disclosure is a method for forming uniform WF metal layers in gate areas of NS structures in a NS FET device.

An aspect of the present disclosure is a NS FET device including uniform WF metal layers in gate areas of NS structures.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure some technical effects may be achieved in part by a method including providing NS structures, parallel to and spaced from each other, in a substrate; conformally forming gate dielectric and metal layers, respectively, on all surfaces in a gate area of each NS structure; forming a barrier layer on surfaces in the gate area of each NS structure except on surfaces in between the NS structures by physical vapor deposition (PVD) or plasma enhanced chemical vapor deposition (PECVD); annealing the NS structures including the gate dielectric and metal layers; removing the barrier and metal layers from all surfaces; and forming a work-function WF metal layer on all surfaces in the gate area of each NS structure.

Another aspect includes forming the barrier layer by PVD of a silicon (Si) layer. In one aspect, the barrier layer is an oxygen barrier layer.

A further aspect includes forming the gate dielectric layer by ALD of a high-k dielectric layer.

An additional aspect includes forming S/D regions adjacent to the gate area on each NS structure.

One aspect includes forming the barrier layer by PECVD of silicon nitride (SiN).

An additional aspect includes forming the gate dielectric layer of hafnium oxide.

Another aspect includes forming the gate metal layer by ALD.

A further aspect includes forming the gate metal layer of TiN to a thickness of 10 to 20 angstroms (Å).

In one aspect, spaces between the NS structures are less than 5 nm.

Another aspect of the present disclosure includes a device including: NS structures, parallel to and spaced from each other, in a substrate; a gate dielectric layer annealed on all surfaces in a gate area of each NS structure; and a work-function WF metal layer formed on all surfaces in the gate area of each NS structure.

A further aspect includes S/D regions adjacent to the gate area on each NS structure. In one aspect, the gate dielectric layer is hafnium oxide.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which:

FIGS. 1A and 1B illustrate a three-dimensional view and a cross-sectional view, respectively, of example NS structures in a NS FET, and FIGS. 1C through 1F illustrate cross-sectional views of gate areas in a process for forming the NS structures;

DETAILED DESCRIPTION

For the purposes of clarity, in the following description, numerous specific details are set forth to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses the problem of non-uniform WF metal layers on NS structure surfaces in gate areas attendant upon forming ALD TiN and CVD Si prior to WF metal deposition on NS structures in NS FET devices. The present disclosure addresses and solves such problems, for instance, by, inter alia, depositing an oxygen barrier by PVD or PECVD, thereby preventing formation of pinch-off areas in the gate areas between adjacent NS structures during an annealing process, before formation of the WF metal layers.

Figure 2B:
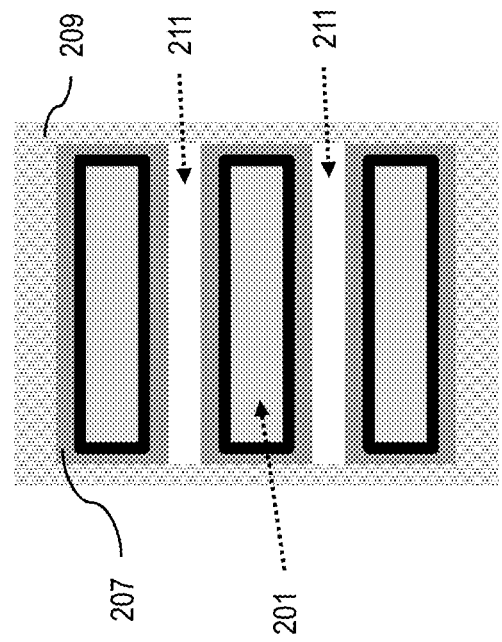
FIGS. 2A through 2D illustrate cross-sectional views of a process for forming uniform WF metal layers in gate areas of NS structures in a NS FET, in accordance with an exemplary embodiment.
Figure 2A:
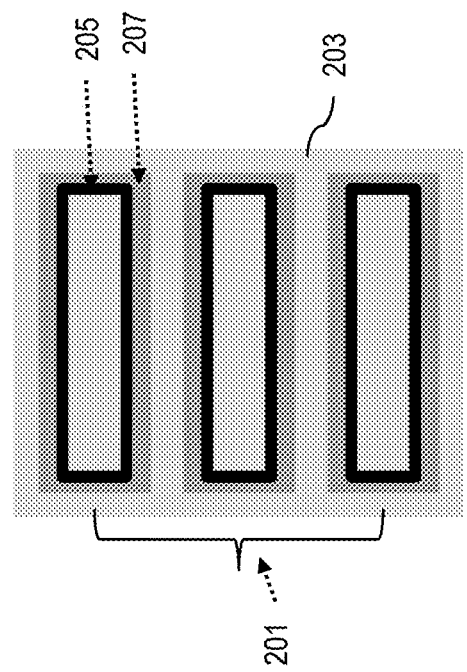

FIG. 2A illustrates a cross-sectional view of a gate area (e.g. similar to that of FIG. 1A) with NS structures 201, parallel to and spaced from each other, in a substrate 203. Gate dielectric layers 205 (e.g. a high-k dielectric) and metal layers 207 are conformally formed, respectively, on all surfaces in the gate area of each NS structure 201. The gate dielectric (e.g. hafnium-oxide) and metal layers may be formed by ALD, and the gate metal layer may be formed of TiN to a thickness of 10 to 20 Å.

Adverting to FIG. 2B, a barrier layer 209 is formed, for example, by PVD of a Si layer or PECVD of a SiN layer, on all exterior surfaces of the metal layers 207 in the gate area of each NS structure 201 (i.e. excluding the surfaces in spaces 211 in between the NS structures 201). An annealing process is performed on the NS structures 201, including the gate dielectric layers 205 and metal layers 207. The barrier layer 209 may act as an oxygen barrier layer during the annealing process.

Figure 2C:
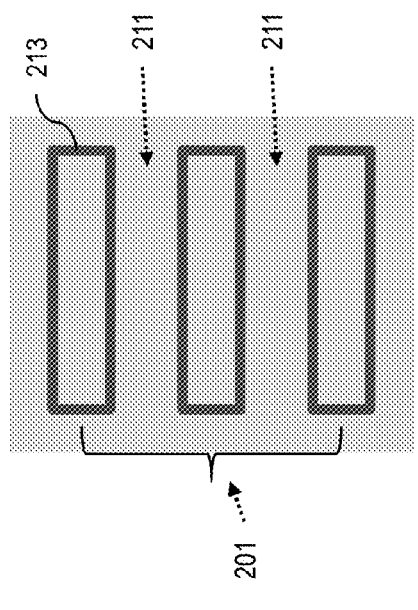

In FIG. 2C, the barrier layer 209 and metal layers 207 are removed, respectively, from all surfaces of the annealed gate dielectric layer 213 surrounding the NS structures 201. As illustrated, there are no residual metal or barrier layer materials, i.e., no pinch-off, remaining in the spaces 211.

Figure 2D:
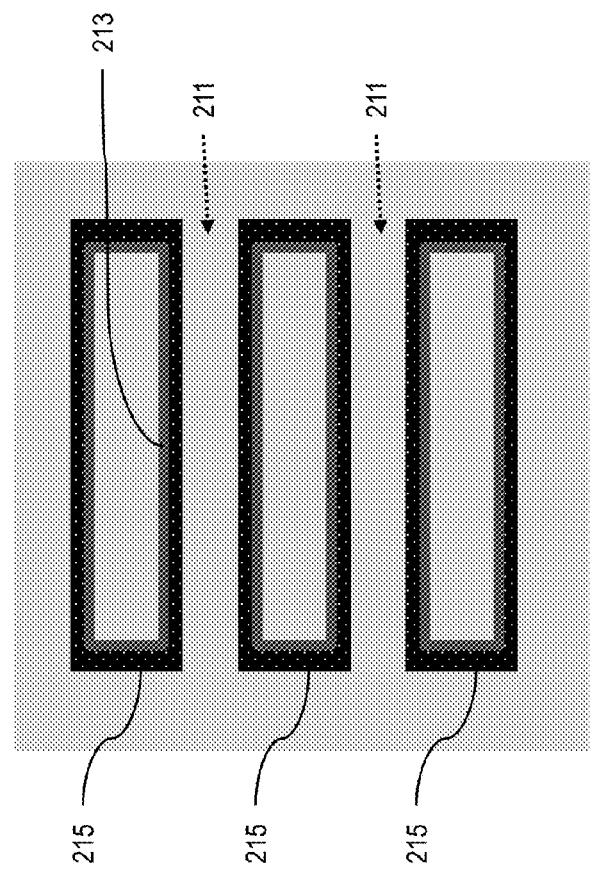

In FIG. 2D, a WF metal layer 215 (e.g., TiN, titanium-aluminide (TiAl), titanium-carbide (TiC), etc.) is formed on all surfaces of the annealed gate dielectric layer 213, including the surfaces in the spaces 211.

Figure 2E:
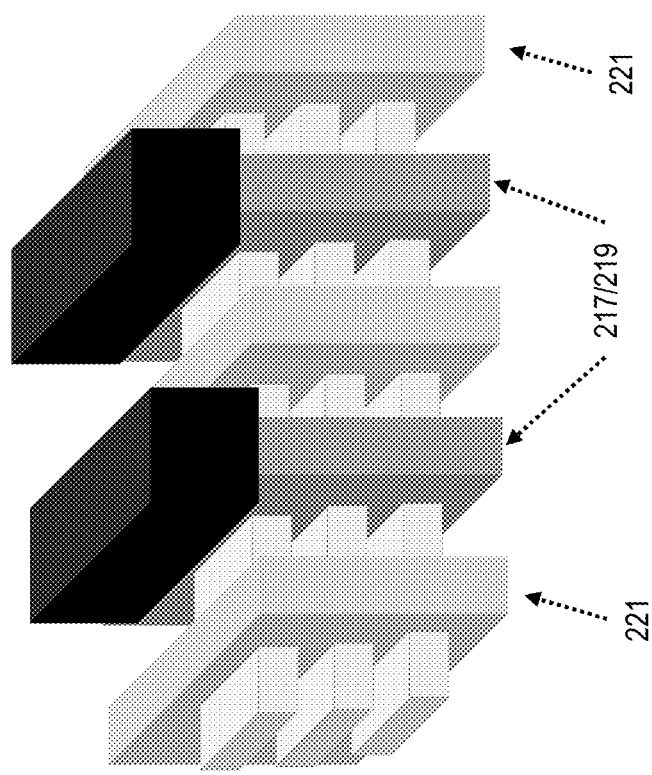
FIG. 2E illustrates a three-dimensional view of NS structures in a NS FET including S/D regions, in accordance with an exemplary embodiment.

FIG. 2E illustrates formation of S/D regions 217/219 adjacent to gate structures 221, wherein a semiconductor material (e.g., Si or silicon-germanium (SiGe)) may be epitaxially grown on surfaces around and in between the NS structures 101.

The embodiments of the present disclosure can achieve several technical effects including no pinch-off between the NS structures resulting in high yield and high performance of NS FET devices. Also, formation of a WF metal layer on all surfaces of a gate area in a NS structure results in uniform threshold voltage and a secured channel area in the gate. In addition, a lower temperature annealing process for the Si may result in less effective-oxide thickness due to less reaction between the high-k dielectric layer and the surrounding semiconductor material (e.g., Si, SiGe), and faster processing times for PVD of Si and/or PECVD of Si or SiN result in manufacturing efficiency and cost reduction. Furthermore, the embodiments enjoy utility in various industrial applications as, for example, microprocessors, smart phones, mobile phones, cellular handsets, set-top boxes, DVD recorders and players, automotive navigation, printers and peripherals, networking and telecom equipment, gaming systems, digital cameras, or other devices utilizing logic or high-voltage technology nodes. The present disclosure therefore enjoys industrial applicability in any of various types of highly integrated semiconductor devices, including devices that use SRAM cells (e.g., liquid crystal display (LCD) drivers, digital processors, etc.)

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
   providing nano-sheet (NS) structures, parallel to and spaced from each other, in a substrate;
   conformally forming gate dielectric and metal layers, respectively, on all surfaces in a gate area of each NS structure;
   forming a barrier layer on surfaces in the gate area of each NS structure except on surfaces in between the NS structures by physical vapor deposition (PVD) or plasma enhanced chemical vapor deposition (PECVD);
   annealing the NS structures including the gate dielectric and metal layers;
   removing the barrier and metal layers from all surfaces; and
   forming a work-function (WF) metal layer on all surfaces in the gate area of each NS structure.

2. The method according to claim 1, comprising forming the barrier layer by PVD of a silicon layer.

3. The method according to claim 1, comprising forming the barrier layer by PECVD of silicon nitride (SiN).

4. The method according to claim 1, wherein the barrier layer is an oxygen barrier layer.

5. The method according to claim 1, comprising forming the gate dielectric layer by atomic layer deposition (ALD) of a high-k dielectric layer.

6. The method according to claim 5, comprising forming the gate dielectric layer of hafnium oxide.

7. The method according to claim 1, further comprising forming source/drain regions adjacent to the gate area on each NS structure.

8. The method according to claim 1, comprising forming the gate metal layer by ALD.

9. The method according to claim 8, comprising forming the gate metal layer of titanium nitride (TiN) to a thickness of 10 to 20 angstroms (Å).

10. The method according to claim 1, wherein spaces between NS structures are less than 5 nanometers (nm).

11. A device comprising:
   nano-sheet (NS) structures, parallel to and spaced from each other, in a substrate;
   a gate dielectric layer annealed on all surfaces in a gate area of each NS structure; and
   a work-function (WF) metal layer formed on all surfaces in the gate area of each NS structure.

12. The device according to claim 11, comprising source/drain regions adjacent to the gate area on each NS structure.

13. The device according to claim 11, wherein the gate dielectric layer is hafnium oxide.

14. A method comprising:
   providing nano-sheet (NS) structures, parallel to and spaced from each other, in a substrate;
   conformally forming high-k gate dielectric and metal layers, respectively, on all surfaces in a gate area of each NS structure;
   forming an oxygen barrier layer on surfaces in the gate area of each NS structure except on surfaces in between the NS structures by physical vapor deposition (PVD) or plasma enhanced chemical vapor deposition (PECVD);
   annealing the NS structures including the gate dielectric and metal layers;
   removing the oxygen barrier and metal layers from all surfaces; and
   forming a work-function (WF) metal layer on all surfaces in the gate area of each NS structure.

15. The method according to claim 14, comprising forming the oxygen barrier layer by PVD of a silicon layer.

16. The method according to claim 14, comprising forming the oxygen barrier layer by PECVD of silicon nitride (SiN).

17. The method according to claim 14, comprising forming the gate dielectric layer by atomic layer deposition (ALD) of hafnium oxide.

18. The method according to claim 14, comprising forming source/drain regions adjacent to the gate area on each NS structure.

19. The method according to claim 14, comprising forming the gate metal layer of titanium nitride (TiN).

20. The method according to claim 19, comprising forming the gate metal layer to a thickness of 10 to 20 angstroms (Å).

* * * * *